(12) United States Patent
Luo et al.

(10) Patent No.: US 9,543,423 B2
(45) Date of Patent: Jan. 10, 2017

(54) HOT-ELECTRON TRANSISTOR HAVING MULTIPLE MSM SEQUENCES

(71) Applicant: CARNEGIE MELLON UNIVERSITY, Pittsburgh, PA (US)

(72) Inventors: Yi Luo, Pittsburgh, PA (US); Yixuan Chen, Pittsburgh, PA (US); Rozana Hussin, Pittsburgh, PA (US); Richard Carley, Sewickley, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 14/425,403

(22) PCT Filed: Sep. 4, 2013

(86) PCT No.: PCT/US2013/058053
§ 371 (c)(1),
(2) Date: Mar. 3, 2015

(87) PCT Pub. No.: WO2014/039550
PCT Pub. Date: Mar. 13, 2014

(65) Prior Publication Data
US 2015/0255588 A1 Sep. 10, 2015

Related U.S. Application Data

(60) Provisional application No. 61/743,438, filed on Sep. 4, 2012.

(51) Int. Cl.
*H01L 29/08* (2006.01)
*H01L 29/80* (2006.01)
(Continued)

(52) U.S. Cl.
CPC ........... *H01L 29/7606* (2013.01); *H01L 21/24* (2013.01); *H01L 29/04* (2013.01); *H01L 29/0649* (2013.01);
(Continued)

(58) Field of Classification Search
CPC ...... H01L 29/7606; H01L 29/45; H01L 29/04; H01L 29/775; H01L 2924/13071
See application file for complete search history.

(56) References Cited

U.S. PATENT DOCUMENTS 3,553,365 A * 1/1971 Jauernik .................. H04N 5/10
327/141
4,038,563 A * 7/1977 Zuleeg ............. H03K 19/09407
257/272
(Continued)

FOREIGN PATENT DOCUMENTS

JP          61-35384      2/1986
KR    10-2010-0037007    4/2010
(Continued)

OTHER PUBLICATIONS

International Search Report and Written Opinion dated Dec. 27, 2013 for International Appln. No. PCT/US2013/058053 (8 pgs.).
(Continued)

*Primary Examiner* — Thomas L Dickey
*Assistant Examiner* — Damon Hillman
(74) *Attorney, Agent, or Firm* — Fish & Richardson P.C.

(57) ABSTRACT

In one aspect, a transistor comprises a metal emitter, a first semiconductor barrier, a metal base, a second semiconductor barrier, and a metal collector. The first semiconductor barrier separates the metal emitter and the metal base and has an average thickness based on a first mean free path of a charge carrier in the first semiconductor barrier emitted from the metal emitter. The second semiconductor barrier separates
(Continued)

the metal base from the metal collector and has an average thickness based on a second mean free path of the charge carrier in the second semiconductor barrier injected from the metal base. The metal base comprises two or more metal layers and has an average thickness based on a multi-layer mean free path of the charge carrier.

36 Claims, 10 Drawing Sheets

(51) Int. Cl.
  *H01L 29/76*   (2006.01)
  *H01L 29/66*   (2006.01)
  *H01L 21/24*   (2006.01)
  *H01L 29/04*   (2006.01)
  *H01L 29/06*   (2006.01)
  *H01L 29/45*   (2006.01)

(52) U.S. Cl.
  CPC .............. *H01L 29/08* (2013.01); *H01L 29/45* (2013.01); *H01L 29/66931* (2013.01)

(56) References Cited

U.S. PATENT DOCUMENTS

| | | | |
|---|---|---|---|
| 4,484,211 A * | 11/1984 | Takemoto | H01L 29/7325 257/515 |
| 5,019,530 A | 5/1991 | Kleinsasser et al. | |
| 5,331,186 A * | 7/1994 | Morizuka | H01L 21/28 257/198 |
| 5,859,464 A | 1/1999 | Hollricher et al. | |
| 5,907,159 A * | 5/1999 | Roh | H01L 29/7606 257/191 |
| 8,399,883 B2 | 3/2013 | Park et al. | |
| 2004/0016922 A1 | 1/2004 | Allenspach et al. | |
| 2004/0178468 A1 | 9/2004 | McFarland et al. | |
| 2006/0220162 A1 | 10/2006 | Sato et al. | |
| 2007/0015348 A1 | 1/2007 | Hsu et al. | |
| 2008/0128713 A1 | 6/2008 | Saito et al. | |
| 2008/0217603 A1 * | 9/2008 | Takeda | H01L 29/7606 257/29 |
| 2010/0102298 A1 | 4/2010 | Wu | |
| 2010/0175745 A1 | 7/2010 | Kostecki et al. | |
| 2010/0237313 A1 | 9/2010 | Mikawa et al. | |
| 2011/0210260 A1 | 9/2011 | Sekiguchi | |
| 2012/0068157 A1 * | 3/2012 | Kub | B82Y 10/00 257/15 |
| 2012/0295413 A1 | 11/2012 | Fujii et al. | |
| 2013/0162333 A1 | 6/2013 | Colli et al. | |
| 2014/0034909 A1 | 2/2014 | Mantese et al. | |
| 2015/0137178 A1 | 5/2015 | Hussin et al. | |

FOREIGN PATENT DOCUMENTS

| | | |
|---|---|---|
| WO | WO2005106927 | 11/2005 |
| WO | WO2014039550 | 3/2014 |

OTHER PUBLICATIONS

Rozana Hussin et al., "Metal-semiconductor-metal heterojunction diodes consisting of a thin layer of crystal silicon," Applied Physics Letters 102:pp. 1-4, (2013).
Ch. Buchal et al., "Silicon-Based Metal-Semiconductor-Metal Detectors," MRS Bulletin, pp. 55-59 (1998).
F. Ruders et al., "Vertical MSM photodiodes in silicon based on epitaxial Si/CoSi2/Si," Thin Solid Films 294 (1997) 351-353.
S. M. Sze et al., "Current Transport in Metal-Semiconductor-Metal (MSM) Structures," Solid-State Electronics Pergamon Press 1971. vol. 14, pp. 1209-1218.
European Search Report in corresponding Application No. 13778627.3, dated Nov. 3, 2015, pp. 1-8.
International Search Report and Written Opinion dated Sep. 25, 2013 for Int'l. Appln. No. PCT/US2013/037358, 12 pgs.
Non-Final Office Action in U.S. Appl. No. 14/391,123 dated Jul. 14, 2015, pp. 1-9.
Response to Non-Final Office Action in U.S. Appl. No. 14/391,123 dated Jul. 14, 2015, filed Oct. 13, 2015, pp. 1-9.
Final Office Action in U.S. Appl. No. 14/391,123 dated Dec. 31, 2015, pp. 1-12.

\* cited by examiner (m)

(n)

(o)

(p)

HOT-ELECTRON TRANSISTOR HAVING MULTIPLE MSM SEQUENCES

CROSS-REFERENCE TO RELATED APPLICATIONS

This application is a §371 National Stage Application of PCT/US2013/058053, filed Sep. 4, 2013, which claims the benefit of priority under 35 U.S.C. §119(e) to provisional U.S. Patent Application No. 61/743,438, filed on Sep. 4, 2012, the entire contents of which are hereby incorporated by reference.

FIELD OF USE

The present disclosure relates generally to transistors, and specifically to hot electron transistors.

BACKGROUND

Metal base hot-electron transistors (HETs) may be used for high-speed applications due to the fast electron transport speed and low resistive-capacitive (RC) delays across a metal base region of the transistor. However, some metal base HETs may exhibit low carrier transmission rate from the metal base into the semiconductor collector due to 1) the scattering inside the metal base, 2) the quantum reflection of carriers at the large potential step at the base-collector interface, and 3) the backward scattering by phonons inside the collector, which may cause the current gains of the metal base HETs to be less than unity.

SUMMARY

The present disclosure describes apparatus and methods relating to a hot-electron transistor (HET) having metal terminals. The transistor includes sequences of metal, semiconductor, and metal, with the semiconductor layers serving as barriers. A metal emitter thermionically launches electrons, which travel across a base heterojunction structure ballistically to reach a metal collector. The collector current is switchable by controlling the base potential to adjust the emitter-base junction barrier height.

In one aspect of the present disclosure, a transistor comprises a first metal-semiconductor-metal sequence comprising a metal emitter, a first semiconductor barrier and a metal base; wherein the first semiconductor barrier separates the metal emitter and the metal base, with the first semiconductor barrier having an average thickness being based on a first mean free path of a charge carrier in the first semiconductor barrier emitted from the metal emitter; and a second metal-semiconductor-metal sequence comprising the metal base, a second semiconductor barrier, and a metal collector, wherein the first and the second metal-semiconductor-metal sequences at least partially overlap with each other to share the metal base; wherein the second semiconductor barrier separates the metal base from the metal collector, with the second semiconductor barrier having an average thickness being based on a second mean free path of the charge carrier in the second semiconductor barrier injected from the metal base; wherein one or more of the first metal-semiconductor-metal sequence and the second metal-semiconductor-metal sequence increases a carrier transmission rate from the metal emitter to the metal collector, relative to another carrier transmission rate of the metal emitter to another type of collector; and wherein the metal base comprises two or more metal layers and an average thickness of the metal base is based on a multi-layer mean free path of the charge carrier.

Implementations of the disclosure can include one or more of the following features. The other type of collector comprises a semiconductor collector. The first and the second metal-semiconductor-metal sequences decrease a circuit delay relative to a circuit delay with a semiconductor collector and a semiconductor emitter. A current gain of the transistor is higher than unity. The second metal-semiconductor-metal sequence decreases an amount of backward scattering of the charge carrier between the metal base and the metal collector, relative to an amount of backward scattering of the second charge carrier between another metal base and the other type of collector. Each of the metal emitter, the metal base, and the metal collector comprises one or more of silver (Ag), aluminum (Al), gold (Au), cobalt (Co), chromium (Cr), copper (Cu), gadolinium (Gd), hafnium (Hf), indium (In), iridium (Ir), magnesium (Mg), manganese (Mn), molybdenum (Mo), nickel (Ni), lead (Pb), palladium (Pd), platinum (Pt), rhodium (Rh), tantalum (Ta), titanium (Ti), tungsten (W), and zinc (Zn). The metal base comprises at least two metal layers. The metal base comprises a first layer, a second layer and a third layer between the first layer and the second layer, wherein the third layer includes a material that has a carrier mean free path with an increased length, relative to lengths of carrier mean free paths of other materials, wherein the material decreases series resistance of the metal base relative to other series resistances of other metal bases, and wherein the third layer promotes resistance to oxidation and promotes bonding between the first and the second metal layers. The average thickness of the metal base is one or more of (i) less than the multi-layer mean free path of the charge carrier in transiting the layers of the metal base, and (ii) comparable to the multi-layer mean free path of the charge carrier in transiting the layers of the metal base. The average thickness of the metal base is in a range from about 2 nm to 50 nm. The average thickness of the first semiconductor barrier is less than four times the first mean free path of the charge carrier in the first semiconductor barrier emitted from the metal emitter. The average thickness of the second semiconductor barrier is less than four times the second mean free path of the charge carrier in the second semiconductor barrier injected from the metal base. The average thickness of at least one of the first semiconductor barrier and the second semiconductor barrier is in a range from about 5 nm to 200 nm. A barrier height of the first semiconductor barrier is greater than a barrier height of the second semiconductor barrier. Each of the first semiconductor barrier and the second semiconductor barrier comprises one or more of a crystalline semiconductor and a polycrystalline semiconductor. Each of the first semiconductor barrier and the second semiconductor barrier comprises one or more of silicon (Si), germanium (Ge), silicon germanium (SiGe), aluminum antimonide (AlSb), gallium antimonide (GaSb), gallium arsenide (GaAs), indium antimonide (InSb), indium arsenide (InAs), indium gallium arsenide (InGaAs), gallium nitride (GaN), indium phosphide (InP), cadmium selenide (CdSe), cadmium telluride (CdTe), cadmium sulfide (CdS), zinc selenide (ZnSe), zinc telluride (ZnTe), zinc sulfide (ZnS), zinc oxide (ZnO), titanium oxide (TiO2), lead sulfide (PbS), and lead telluride (PbTe). An average transit delay through the first semiconductor barrier is less than 20 femtoseconds. An average transit delay through the second semiconductor barrier is less than 20 femtoseconds. An average resistance-capacitance (RC) delay in the metal base is less than 20 femtoseconds. An average transit delay through the metal base is less than 20 femtoseconds. The transistor has a total delay of less than 80 femtoseconds. The transistor has a cut-off frequency exceeding 2 THz.

In another aspect of the present disclosure, a method for fabricating a transistor includes depositing a first metal layer and a second metal layer on a first semiconductor-on-insulator (SOI) wafer to yield a first layered SOI wafer; depositing a third metal layer and a fourth metal layer on a second SOI wafer to yield a second layered SOI wafer; bonding the first layered SOI wafer to the second layered SOI wafer; removing a portion of the first layered SOI wafer, leaving a first semiconductor layer; depositing a fifth metal layer on a portion of the first semiconductor layer to form a metal collector; removing an exposed portion of the first semiconductor layer to form a first semiconductor barrier under the metal collector, the first semiconductor barrier having an average thickness based on a first mean free path of a charge carrier in the first semiconductor barrier; patterning the first, the second, the third, and the fourth metal layers using a first negative resist, leaving portions of the first, the second, the third, and the fourth metal layers under the first semiconductor barrier and under the first negative resist; removing the first negative resist; removing a portion of the second SOI wafer, leaving a second semiconductor layer; depositing a sixth metal layer on a portion of the second semiconductor layer to form a metal emitter; removing an exposed portion of the second semiconductor layer to form a second semiconductor barrier under the metal emitter, the second semiconductor barrier having an average thickness being based on a second mean free path of the charge carrier in the second semiconductor barrier emitted from the metal emitter; patterning the first, the second, the third, and the fourth metal layers using a second negative resist, leaving portions of the first, the second, the third, and the fourth metal layers under the second semiconductor barrier and under the second negative resist to form a metal base, the metal base having an average thickness being based on a multi-layer mean free path of the charge carrier; and removing the second negative resist.

Implementations of the disclosure can include one or more of the following features. Each of the first metal layer, the second metal layer, the third metal layer, the fourth metal layer, the fifth metal layer, and the sixth metal layer comprises one or more of silver (Ag), aluminum (Al), gold (Au), cobalt (Co), chromium (Cr), copper (Cu), gadolinium (Gd), hafnium (Hf), indium (In), iridium (Ir), magnesium (Mg), manganese (Mn), molybdenum (Mo), nickel (Ni), lead (Pb), palladium (Pd), platinum (Pt), rhodium (Rh), tantalum (Ta), titanium (Ti), tungsten (W), and zinc (Zn). Each of the first semiconductor layer and the second semiconductor layer comprises one or more of silicon (Si), germanium (Ge), silicon germanium (SiGe), aluminum antimonide (AlSb), gallium antimonide (GaSb), gallium arsenide (GaAs), indium antimonide (InSb), indium arsenide (InAs), indium gallium arsenide (InGaAs), gallium nitride (GaN), indium phosphide (InP), cadmium selenide (CdSe), cadmium telluride (CdTe), cadmium sulfide (CdS), zinc selenide (ZnSe), zinc telluride (ZnTe), zinc sulfide (ZnS), zinc oxide (ZnO), titanium oxide (TiO2), lead sulfide (PbS), and lead telluride (PbTe). The average thickness of the first semiconductor barrier is less than four times the first mean free path of the charge carrier in the first semiconductor barrier. The average thickness of the second semiconductor barrier is less than four times the second mean free path of the charge carrier in the second semiconductor barrier. A barrier height of the first semiconductor barrier is less than a barrier height of the second semiconductor barrier. The second metal layer and the fourth metal layer includes a material that has a carrier mean free path with an increased length, relative to lengths of carrier mean free paths of other materials, wherein the material decreases series resistance of the metal base relative to other series resistances of other metal bases, and wherein the material promotes resistance to oxidation and promotes bonding between the first layered SOI wafer and the second layered SOI wafer. The average thickness of the metal base is one or more of (i) less than the multi-layer mean free path of the charge carrier in transiting the layers of the metal base of the metal base, and (ii) comparable to the multi-layer mean free path of the charge carrier in transiting the layers of the metal base. Bonding the first layered SOI wafer to the second layered SOI wafer comprises: diffusive bonding of the second metal material included in the first bi-metal layer and the second bi-metal layer at an average temperature of about 200 degrees Celsius under pressure. The method includes after removing the first negative resist, depositing a monomer onto the metal collector and an exposed portion of the second SOI wafer; depositing a fifth metal layer on a carrier wafer to form a ground plane; bonding the deposited monomer to the deposited fifth metal layer; and converting the monomer to a polymer.

In yet another aspect of the present disclosure, a terahertz transistor comprises a first metal-semiconductor-metal sequence comprising a metal emitter, a first semiconductor barrier and a metal base; wherein the metal emitter comprises a gadolinium layer with an average thickness of about 5 nm and a gold layer with an average thickness of about 100 nm; wherein the metal base comprises a cobalt layer with an average thickness of about 2 nm, a gold layer with an average thickness of about 4 nm, and a palladium layer with an average thickness of about 2 nm, wherein the gold layer is between the cobalt layer and the palladium layer, the gold layer has a carrier mean free path with an increased length, relative to other lengths of other carrier mean free paths of other materials, and the gold layer decreases series resistance of the metal base relative to other series resistances of other metal bases; wherein the first semiconductor barrier separates the metal emitter and the metal base, with the first semiconductor barrier comprising silicon with an average thickness of about 20 nm; and a second metal-semiconductor-metal sequence comprising the metal base, a second semiconductor barrier, and a metal collector, wherein the metal collector comprises a cobalt layer with an average thickness of about 5 nm and a gold layer with an average thickness of about 100 nm; wherein the second semiconductor barrier separates the base and the metal collector, with the second semiconductor barrier comprising silicon with an average thickness of about 20 nm; wherein one or more of the first metal-semiconductor-metal sequence and the second metal-semiconductor-metal sequence increases a carrier transmission rate from the metal base into the metal collector, relative to another carrier transmission rate of the metal base into another type of collector; and wherein the increase in the carrier transmission rate facilitates higher than unity current gain, and the terahertz transistor to operate at a terahertz frequency.

The details of one or more implementations are set forth in the accompanying drawings and the description below. Other features, objects, and advantages will be apparent from the description, the drawings, and the claims.

DETAILED DESCRIPTION

Figure 1:
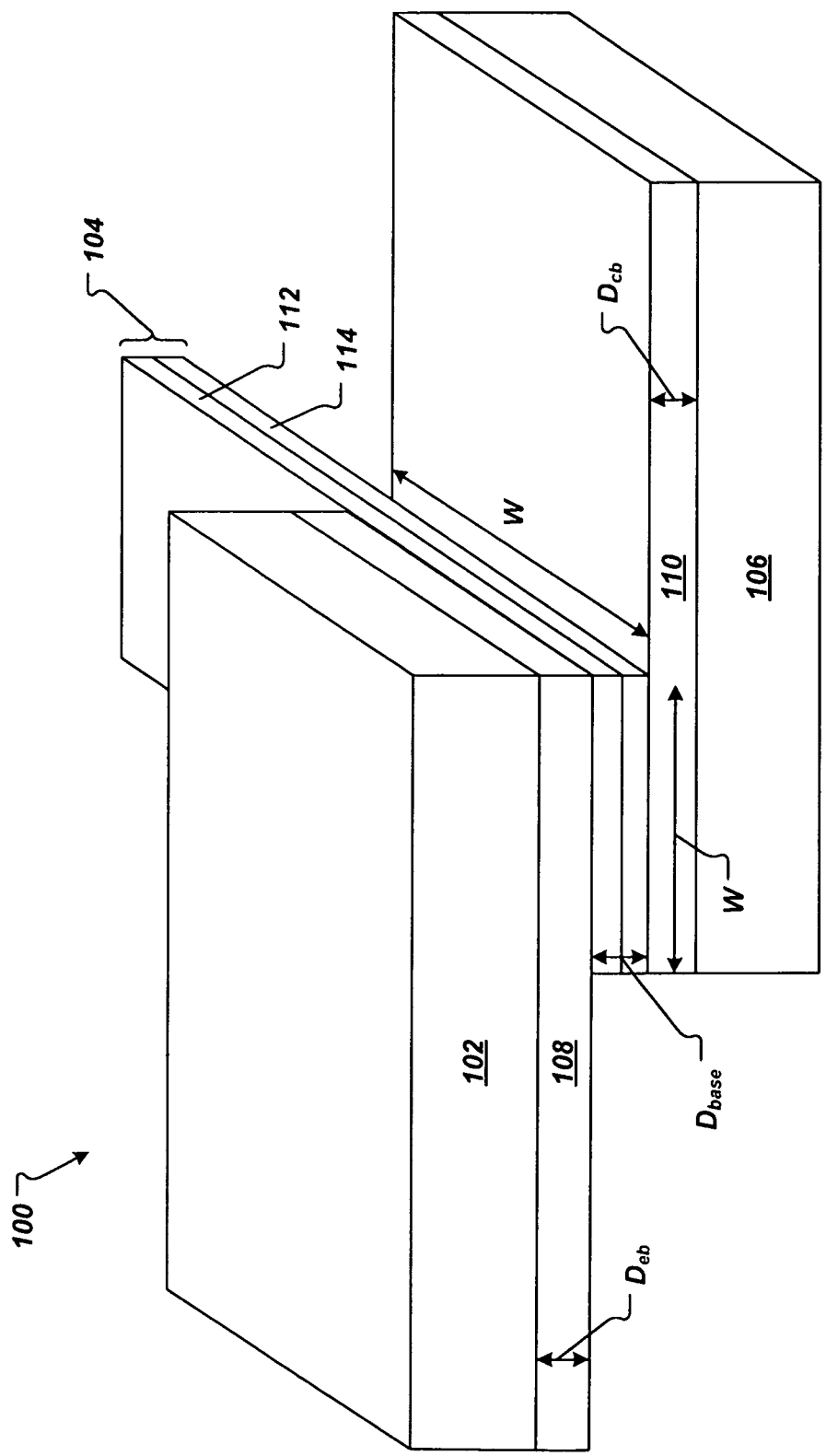
FIG. 1 shows an example of a transistor.

FIG. 1 shows an example of a transistor 100. The transistor 100 may be an all-metal terminal hot-electron transistor (AMTHET). The transistor 100 may include sequences of metal, semiconductor, and metal, with a metal emitter 102, a semiconductor barrier 108, a metal base 104, a semiconductor barrier 110, and a metal collector 106.

The metal base 104 may include two or more metal layers, e.g., layers 112 and 114. In some implementations, the metal base 104 includes a third metal layer (not shown) between metal layers 112 and 114. The third metal layer may include a material that decreases series resistance of the metal base relative to other series resistances of other metal bases. The third metal layer may promote resistance to oxidation and may promote bonding between the metal layers 112 and 114.

The metal base 104 may have an aggregate thickness $D_{base}$ that is less than or comparable to the multi-layer mean free path of a charge carrier (e.g., electrons or holes) transiting the layers of the metal base 104. The multi-layer mean free path of the charge carrier is defined as the length through which the average number of the carrier can transit is reduced to 1/e (where, e=2.718) of the number of carrier initially injected into the multi-layer metal base 104 from the metal emitter 102. The metal base 104 may include a material that has a carrier mean free path with an increased length, relative to lengths of carrier mean free paths of other materials. For example, the metal base 104 may have an average aggregate thickness $D_{base}$ in a range from about 2 nm to 50 nm, such as a thickness of 20 nm.

The metal materials of the metal emitter 102, the metal base 104, and the metal collector 106 may include silver (Ag), aluminum (Al), gold (Au), cobalt (Co), chromium (Cr), copper (Cu), gadolinium (Gd), hafnium (Hf), indium (In), iridium (Ir), magnesium (Mg), manganese (Mn), molybdenum (Mo), nickel (Ni), lead (Pb), palladium (Pd), platinum (Pt), rhodium (Rh), tantalum (Ta), titanium (Ti), tungsten (W), or zinc (Zn). Other suitable materials different than those listed above may be used.

The metal emitter 102 and the metal base 104 may be separated by the semiconductor barrier 108. The metal base 104 and the metal collector 106 may be separated by the semiconductor barrier 110. The semiconductor barriers 108 and 110 may each have a corresponding thickness $D_{eb}$ and $D_{cb}$ that is based on, e.g., close, comparable to, or less than four times, the corresponding mean free path of the charge carrier in the semiconductor barrier. For example, the semiconductor barriers 108 and 110 may each have a corresponding average thickness $D_{eb}$ and $D_{cb}$ in a range from about 5 nm to 200 nm, such as 10 nm.

The semiconductor barriers 108 and 110 may each include a very thin film of a crystalline semiconductor, such as a single-crystal crystalline semiconductor or a polycrystalline semiconductor. For example, the semiconductor barriers 108 and 110 may each include silicon (Si), germanium (Ge), silicon germanium (SiGe), aluminum antimonide (AlSb), gallium antimonide (GaSb), gallium arsenide (GaAs), indium antimonide (InSb), indium arsenide (InAs), indium gallium arsenide (InGaAs), indium phosphide (InP), cadmium selenide (CdSe), cadmium telluride (CdTe), lead sulfide (PbS), or lead telluride (PbTe). Other suitable materials different than those listed above may be used.

Figure 2:
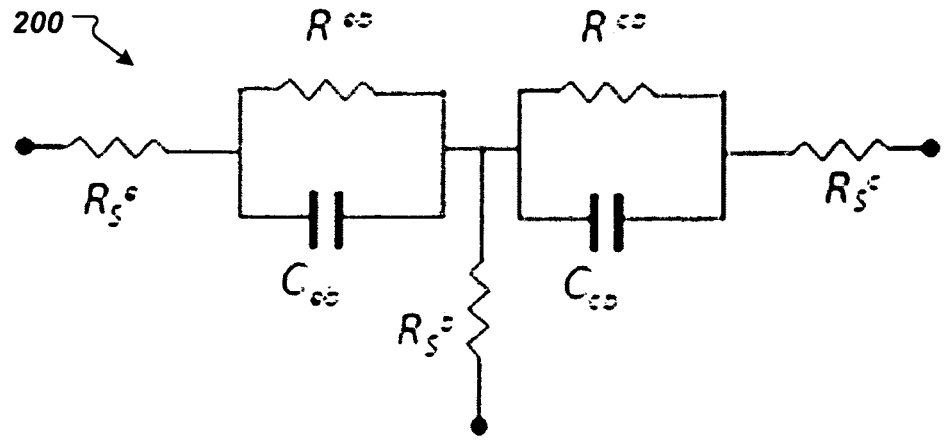
FIG. 2 shows a schematic of an equivalent circuit of the transistor of FIG. 1.

FIG. 2 shows a schematic of an equivalent circuit 200 of the transistor 100 of FIG. 1. The metal emitter 102 is equivalent to a resistor $R_S^e$. The semiconductor barrier 108 is equivalent to a resistor $R_j^{eb}$ and a capacitor $C_{eb}$ in parallel. The metal base 104 is equivalent to a resistor $R_S^b$. The semiconductor barrier 110 is equivalent to a resistor $R_j^{cb}$ and a capacitor $C_{cb}$ in parallel. The metal collector 106 is equivalent to a resistor $R_S^c$. The circuit delay of the transistor 100 is decreased relative to a circuit delay of a transistor with a semiconductor collector and a semiconductor emitter.

Figure 3:
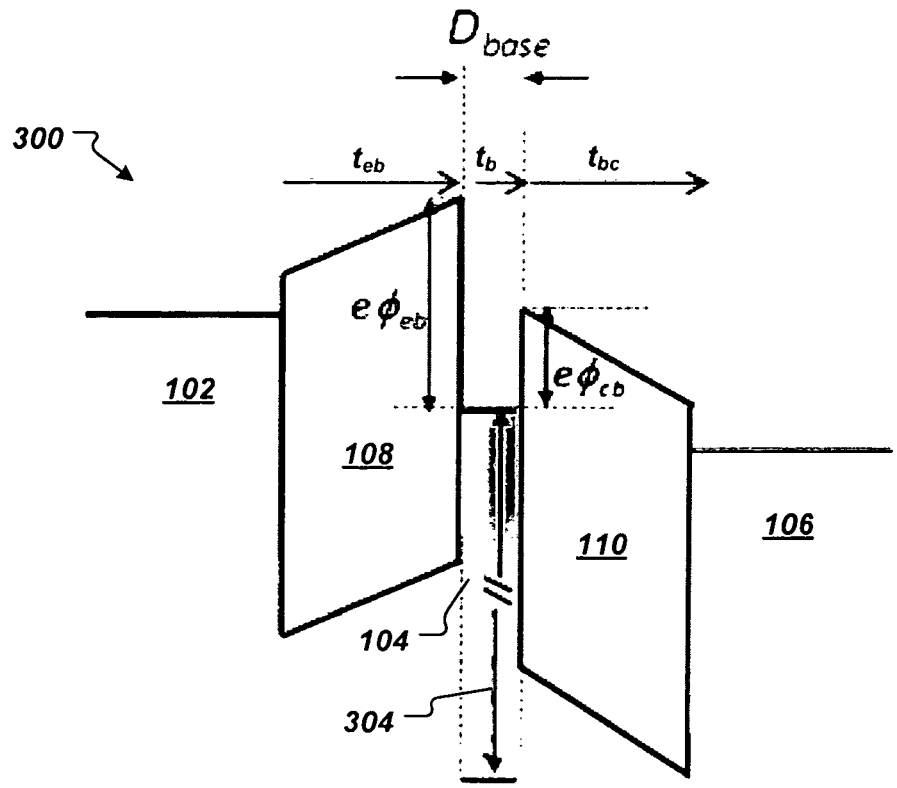
FIG. 3 shows an energy band diagram of the transistor of FIG. 1.

FIG. 3 shows an energy band diagram 300 of the transistor 100 of FIG. 1. The semiconductor barrier 108 may have a barrier height of $e\phi_{eb}$. The semiconductor barrier 110 may have a barrier height of $e\phi_{cb}$. The barrier height of the semiconductor barrier 108 may be greater than the barrier height of the semiconductor barrier 110. The collector current may be switchable by the barrier height $e\phi_{eb}$ of the emitter-base semiconductor barrier 108, which is controlled by the base potential 304. The base potential 304 may be, for example, in a range from 2 eV to 3 eV.

The use of a metal-semiconductor-metal heterostructure as the base-collector junction may increase the carrier injection rate towards the collector, and may thereby provide high current gains. For example, a current gain (β) of higher than unity gain, e.g., a gain of factor higher than 10, may be obtained for the transistor 100. For an emitter current of 100 μA, the emitter-base junction of the transistor 100 may exhibit a current-voltage characteristic of up to 140 μA at about 1.2 V, and the collector-base junction of the transistor 100 may exhibit a current-voltage characteristic of up to 200 μA at about 0.3 V.

For electron transport in the AMTHET transistor 100, an electron is launched thermionically by the metal emitter 102 above the emitter-base semiconductor barrier 109. The electron travels across the metal-semiconductor-metal heterojunctions of the metal emitter 102, the semiconductor barrier 109, and the metal base 104 ballistically (with certain chances to be collected by the metal base 104) and reaches the metal collector 106. Electron transport from the emitter to the collector is associated with transit times $t_{eb}$, $t_b$, and $t_{bc}$ through the emitter-base semiconductor barrier 108, the metal base 104, and the base-collector semiconductor barrier 110, respectively.

The speed of the transistor 100 may be estimated by evaluating two delays, the resistive-capacitive (RC) delay and the electron transit delay. The use of metal electrodes in the transistor 100 may result in an extremely low RC delay. The thin semiconductor barriers and thin metal base may result in a very short transit time for hot-electron transport.

In calculating the RC delay, the metal emitter 102 and the metal collector 106 may have corresponding series resistances $R_S^e$ and $R_S^e$ that are very small and negligible as compared to the resistance $R_S^b$ of the metal base 104. The metal base 104 may have a sheet resistance $\rho_s$ in a range from 30Ω/□ to 100Ω/□, with a square size of W=50 nm. In the calculation below, a sheet resistance of $\rho_s$=50Ω/□ is used.

Because the semiconductor barriers 108 and 110 may be undoped and depleted, the capacitance can be estimated with a parallel plate capacitor separated by a material with a dielectric constant, ∈. The capacitance of the transistor 100 can be calculated from the following equations.

$$C_{eh} = \frac{\varepsilon W^2}{D_{eh}}, \quad C_{ch} = \frac{\varepsilon W^2}{D_{ch}}$$

$$C = C_{eh} + C_{ch} = 2 \times \frac{11.9 \times 8.85 \times 10^{-12} \times (50 \times 10^{-9})^2}{10 \times 10^{-9}} = 0.053 fF$$

The RC delay of the transistor 100 may be less than 20 femtoseconds and can be calculated from the following equation.

$$RC \approx \rho_S \cdot C = 50 \, \Omega \times 0.053 \, fF = 2.7 \, fs$$

The total transit delay is the sum of carrier transit times $t_{eb}$, $t_b$, and $t_{bc}$ through the emitter-base semiconductor barrier 108, the metal base 104, and the base-collector semiconductor barrier 110, respectively. The total transit delay may be less than 20 femtoseconds. In the calculations below, an electron effective mass of m*=0.26 m₀, and a barrier height difference of Δϕ=0.5V (under certain DC operation voltage) are used. When a moderate AC signal $\Delta V_{eb}$=0.1V is applied by an antenna, the carrier transit delay $t_{eb}$ through the emitter-base semiconductor barrier 108 may be less than 20 femtoseconds and may be estimated using the following equations.

$$\Delta X = \frac{D_{eh}}{\Delta \phi} \cdot \Delta V_{eh} (\sim 2 \, nm)$$

$$I_{eh} \approx \frac{\Delta X}{\sqrt{\frac{2e\Delta V_{eh}}{m^*}}} =$$

$$\frac{D_{eh}}{\Delta \phi} \sqrt{\frac{m^* \Delta V_{ch}}{2e}} = \frac{10 \times 10^{-9}}{0.5} \sqrt{\frac{0.26 \times 0.91 \times 10^{-30} \times 0.1}{2 \times 1.6 \times 10^{-19}}} = 5.4 \, fs$$

Since the thickness $D_{eb}$ of the semiconductor barrier 108 is less than four times the carrier mean free path (e.g., 35 nm for electrons in lightly doped silicon), the carriers may not reach thermal equilibrium in the semiconductor barrier 108. The majority of the carriers launched from the metal emitter 102 may transport as hot carriers and travel ballistically across the semiconductor barrier 108 even with velocity overshoot.

Carriers are injected into the metal base 104 above the Fermi level of the metal base 104. The total kinetic energy can range from 2 eV to 7 eV depending on the metal and specific energy band the electron will occupy. In the calculation below, a kinetic energy of $E_k$=3.5 eV, a base thickness of $D_{base}$=5 nm, and electron effective mass m*=m₀ is used. The carrier transit delay $t_b$ through the metal base 104 may be less than 20 femtoseconds and can be calculated using the following equation.

$$t_{base} = \frac{D_{base}}{\sqrt{\frac{2E_k}{m^*}}} = \frac{5 \times 10^{-9}}{\sqrt{\frac{2 \times 3.5 \times 1.6 \times 10^{-19}}{0.91 \times 10^{-30}}}} = 4.5 \, fs$$

As shown by the above equation, the transit delay $t_b$ associated with carrier travel through the metal base 104 can be minimized to less than 10 fs.

The time required for an electron to travel across the semiconductor barrier 110 between the metal base 104 and the metal collector 106 poses another delay. The transit delay $t_{cb}$ is defined as the time for an electron to travel the entire thickness $D_{cb}$ of the semiconductor barrier 110. Since the electron is rather energetic, $t_{be}$ can be estimated with a reasonably high $V_{cb}$ (e.g., ~2V). The carrier transit delay $t_{bc}$ through the base-collector semiconductor barrier 110 may be less than 20 femtoseconds and can be estimated using the following equation.

$$t_{base} = \frac{D_{ch}}{\sqrt{\frac{2eV_{ch}}{m^*}}} = \frac{10 \times 10^{-9}}{\sqrt{\frac{2 \times 1.6 \times 10^{-19} \times 2}{0.26 \times 0.91 \times 10^{-30}}}} = 6.1 \, fs$$

For transistors having semiconductor barriers 108 and 110 of silicon (that has a relatively high effective mass of m*=0.26 m₀), the total delay $t_{total}$ may be less than 80 femtoseconds and can be estimated as $t_{total}=t_{RC}+t_{eb}+t_{base}+t_{bc}$=2.7+5.4+4.5+6.1=18.7 fs. The cut-off frequency may be greater than 2 THz and can be calculated as $$f_r = \frac{1}{2\pi t_{total}} = 8.5 \, THz.$$

Further decreases in the transit delay can be obtained by using low effective mass materials, such as gallium arsenide (GaAs) and indium gallium arsenide (InGaAs), for the semiconductor barriers 108 and 110. A transistor with GaAs as the semiconductor barriers may potentially have a cut-off frequency of 11.4 THz.

Figure 4:
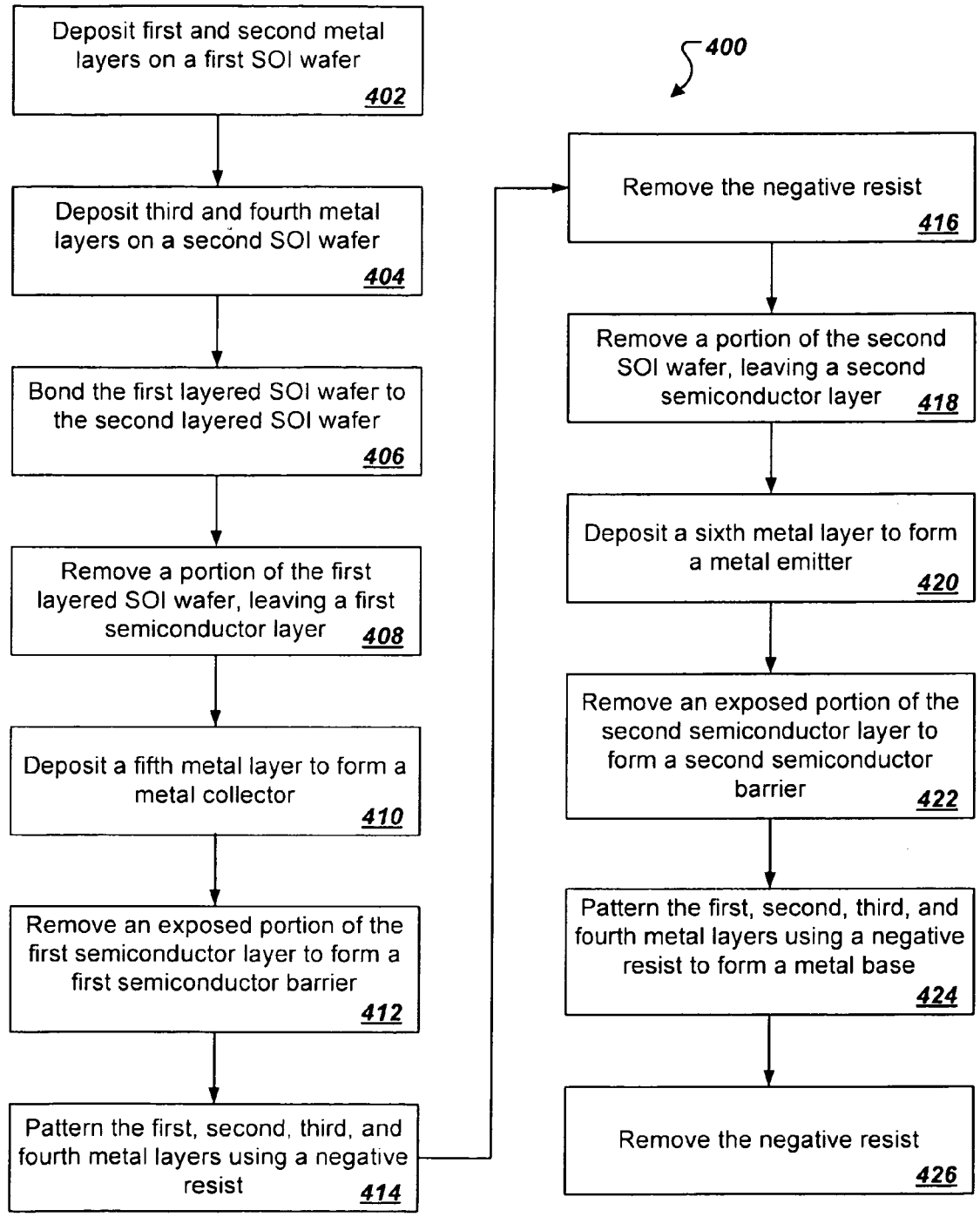
FIG. 4 is a flowchart of a process for fabricating a transistor.

FIG. 4 is a flowchart of a process 400 for fabricating a transistor. Briefly, the process 400 includes depositing a first metal layer and a second metal layer on a first semiconductor-on-insulator (SOI) wafer to yield a first layered SOI wafer (402); depositing a third metal layer and a fourth metal layer on a second SOI wafer to yield a second layered SOI wafer (404); bonding the first layered SOI wafer to the second layered SOI wafer (406); removing a portion of the first layered SOI wafer, leaving a first semiconductor layer (408); depositing a fifth metal layer on a portion of the first semiconductor layer to form a metal collector (410); removing an exposed portion of the first semiconductor layer to form a first semiconductor barrier under the metal collector (412); patterning the first, the second, the third, and the fourth metal layers using a first negative resist, leaving portions of the first, the second, the third, and the fourth metal layers under the first semiconductor barrier and under the first negative resist (414); removing the first negative resist (416); removing a portion of the second SOI wafer, leaving a second semiconductor layer (418); depositing a sixth metal layer on a portion of the second semiconductor layer to form a metal emitter (420); removing an exposed portion of the second semiconductor layer to form a second semiconductor barrier under the metal emitter (422); patterning the first, the second, the third, and the fourth metal layers using a second negative resist, leaving portions of the first, the second, the third, and the fourth metal layers under the second semiconductor barrier and under the second negative resist to form a metal base (424); and removing the second negative resist (426).

FIGS. 5-8 shows side views of a transistor during different stages (a)-(p) of fabrication using the process 400 of FIG. 4. The transistor can be fabricated on a wafer scale.

In stage (a), a layered wafer 500 and a layered wafer 600 are provided. The layered wafer 500 may be, for example, a standard silicon-on-insulator (SOI) wafer that includes a silicon layer 501, an insulator (e.g., $SiO_2$) layer 502, and bulk silicon substrate 503. The silicon layer 501 may have an average thickness of 20 nm. Similarly, the layered wafer 600 may be, for example, a standard silicon-on-insulator (SOI) wafer that includes a silicon layer 601, an insulator (e.g., $SiO_2$) layer 602, and a bulk silicon substrate 603. The silicon layer 601 may have an average thickness of 20 nm.

In stage (b), metal layers 504 and 505 are deposited on the silicon layer 501 of the SOI wafer 500. The material of metal layer 504 may be, for example, cobalt. The material of metal layer 505 may be, for example, gold. Each of the metal layers 504 and 505 may have an average thickness of 2 nm. The metal layers 504 and 505 may be deposited by a physical vapor deposition technique such as sputtering.

Similarly, metal layers 604 and 605 are deposited on the silicon layer 601 of the SOI wafer 600. The material of metal layer 604 may be, for example, palladium. The material of metal layer 605 may be the same material as the material of metal layer 505, e.g., gold. Each of the metal layers 604 and 605 may have an average thickness of 2 nm. The metal layers 604 and 605 may be deposited by a physical vapor deposition technique such as sputtering.

In stage (c), the layered wafer 500 and the layered wafer 600 are bonded together using a flip-bond technique. The layered wafer 500 and the layered wafer 600 may be bonded together by, for example, diffusive bonding of the metal layers 505 and 605 to form a combined metal layer 700. The diffusive bonding of the metal layers 505 and 605 may be performed at 200 degrees Celsius under pressure.

The materials of the metal layers 505 and 605 may be the same material to facilitate bonding of the layered wafers 500 and 600. The materials of the metal layers 505 and 605 may promote resistance to oxidation. For example, the materials of the metal layers 505 and 605 may be a gold material, which has a relatively long electron mean free path. The gold material may decrease the series (lateral) resistance of the metal base of the transistor and may thereby improve performance of the transistor.

In stage (d), the insulator layer 502 and the bulk silicon substrate 503 of the layered wafer 500 are removed, leaving the silicon layer 501. The bulk silicon substrate 503 may be removed by polishing the bulk silicon substrate 503 to remove a majority of the bulk silicon substrate 503. The bulk silicon substrate 503 remaining after the polishing may be removed by selective etching of the remaining bulk silicon substrate 503 using, for example, xenon difluoride ($XeF_2$). The insulator layer 502 may be removed by selective etching, e.g., buffered oxide etch, of the insulator layer 502 using, for example, hydrofluoric acid (HF).

In stage (e), a metal layer 506 is deposited on the silicon layer 501 to form a metal collector. The metal layer 506 may be deposited using electron beam evaporation followed by lift-off. The metal layer 506 may include a layer of cobalt with an average thickness of 5 nm and a layer of gold with an average thickness of 100 nm.

In stage (f), an exposed portion of the silicon layer 501 is removed to form a semiconductor barrier under the metal collector 506. The exposed portion of the silicon layer 501 may be removed using reactive ion etching.

In stage (g), a negative resist 507 is formed on a portion of the metal collector 506 in the shape of a metal base. The negative resist 507 may be formed using aligned electron beam lithography. In stage (h), the metal layers 504, 604, and 700 are patterned using the negative resist 507. The metal layers 504, 604, and 700 may be patterned using selective wet chemical etch to remove exposed portions of the metal layers 504, 604, and 700. In stage (i), the negative resist 507 is removed.

In stage (j), a monomer 508, such as a bisbenzocyclobutene-based (BCB) monomer, is deposited on the metal collector 506 and the exposed portion of silicon layer 601. The monomer 508 may be deposited by spin-coating the monomer 508 on the metal collector 506 and the exposed portion of the silicon layer 601. The monomer 508 may have an average thickness of 8 μm as measured from the silicon layer 601 to the surface of the monomer 508. Also in stage (j), a carrier wafer 701, e.g., a sapphire wafer, with a ground plane 702, e.g., a gold ground plane, deposited on the carrier wafer 701 is provided.

In stage (k), the intermediate device structure of stage (j) is flip-bonded to the carrier wafer 701 by bonding the monomer 508 to the ground plane 702. The monomer 708 is polymerized at approximately 200 degrees Celsius.

In stage (l), the insulator layer 602 and the bulk silicon substrate 603 of the layered wafer 600 are removed, leaving the silicon layer 601. The bulk silicon substrate 603 may be removed by polishing the bulk silicon substrate 603 to remove a majority of the bulk silicon substrate 603. The bulk silicon substrate 603 remaining after the polishing may be removed by selective etching of the remaining bulk silicon substrate 603 using, for example, xenon difluoride ($XeF_2$). The insulator layer 602 may be removed by selective etching, e.g., buffered oxide etch, of the insulator layer 602 using, for example, hydrofluoric acid (HF).

In stage (m), a metal layer 606 is deposited on the silicon layer 601 to form a metal emitter. The metal layer 606 may be deposited using aligned electron beam evaporation followed by lift-off. The metal layer 606 may include a layer of gadolinium with an average thickness of 5 nm and a layer of gold with an average thickness of 100 nm.

In stage (n), an exposed portion of the silicon layer 601 is removed to form a semiconductor barrier under the metal emitter 606. The exposed portion of the silicon layer 601 may be removed using reactive ion etching.

In stage (o), a negative resist 607 is formed on a portion of the metal emitter 606 in the shape of the metal base. The negative resist 607 may be formed using aligned electron beam lithography. In stage (p), the metal layers 504, 604, and 700 are patterned using the negative resist 607 to form the metal base. The metal layers 504, 604, and 700 may be patterned using selective wet chemical etch to remove exposed portions of the metal layers 504, 604, and 700. In stage (p), the negative resist 607 is removed to form a transistor similar to the transistor 100 shown in FIG. 1.

Figure 5:
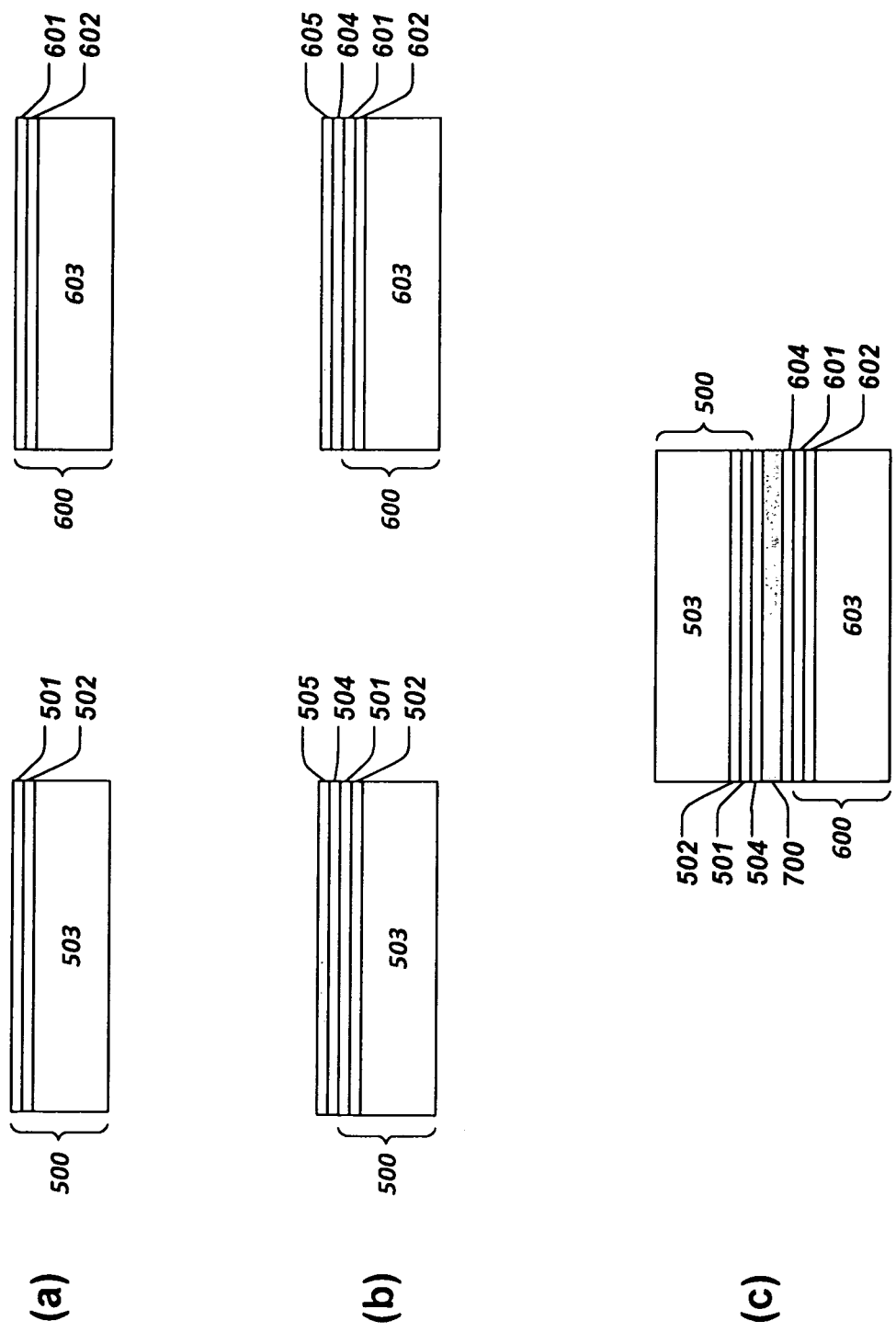
FIGS. 5-8 shows side views of a transistor during different stages (a)-(p) of fabrication using the process of FIG. 4.
Figure 6:
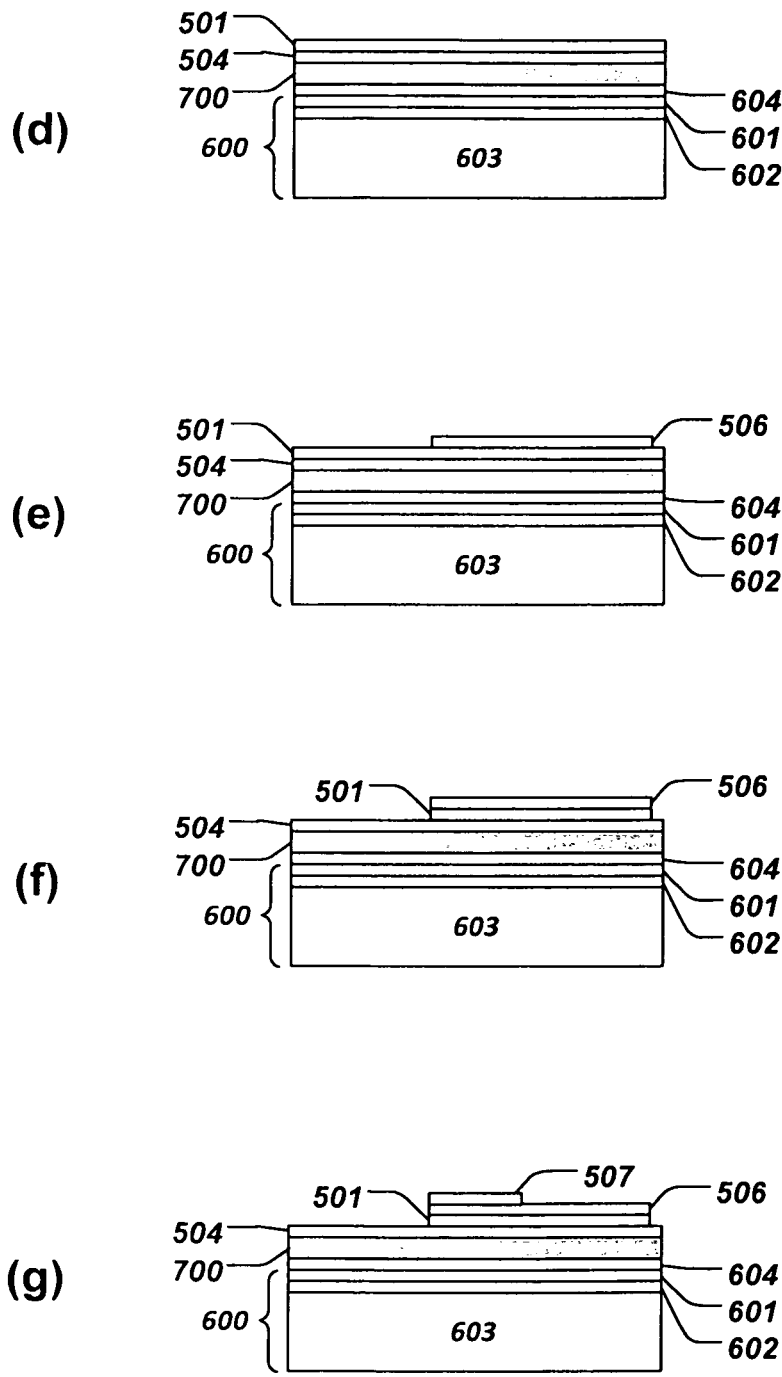
Figure 7:
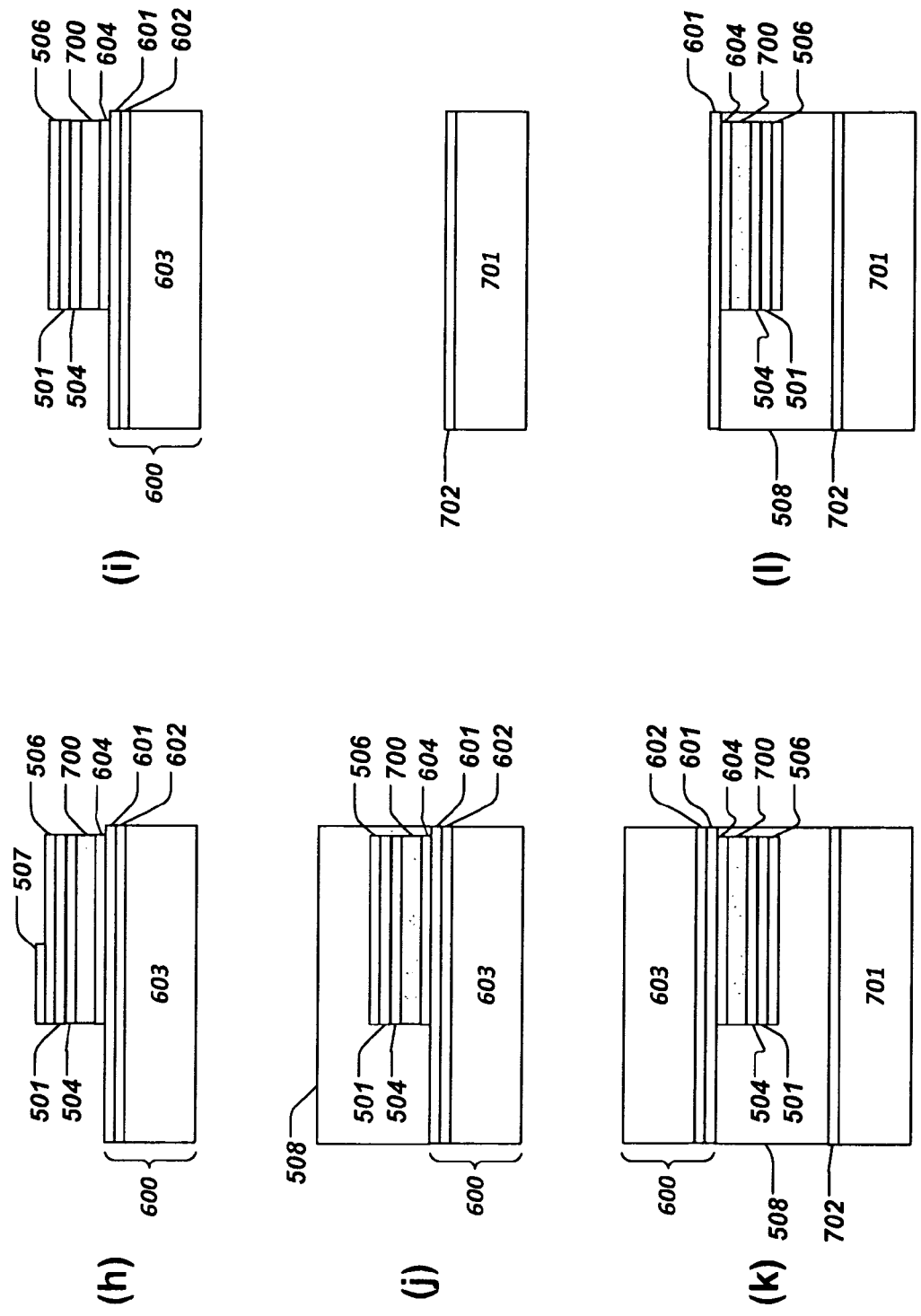
Figure 8:
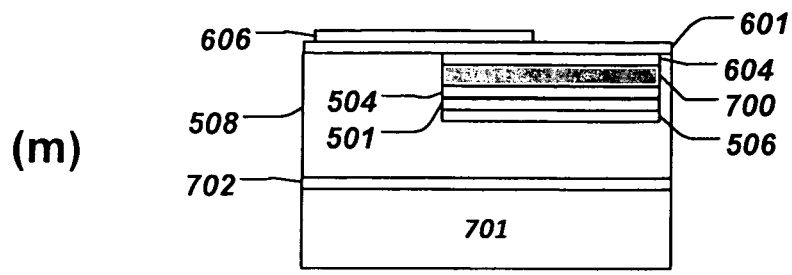
Figure 8:
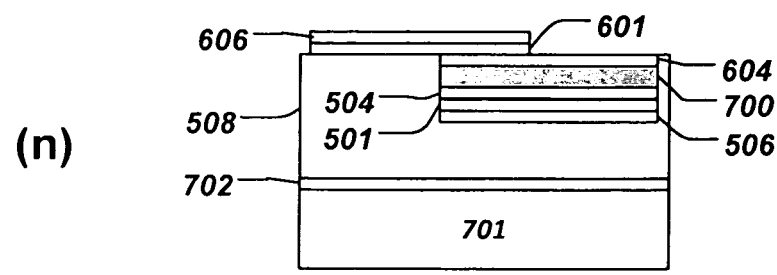
Figure 8:
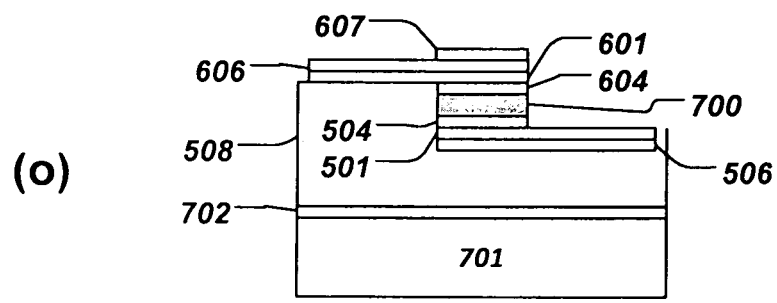
Figure 8:
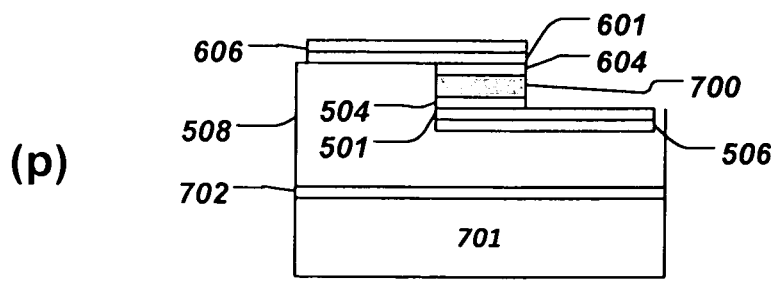
Figure 9:
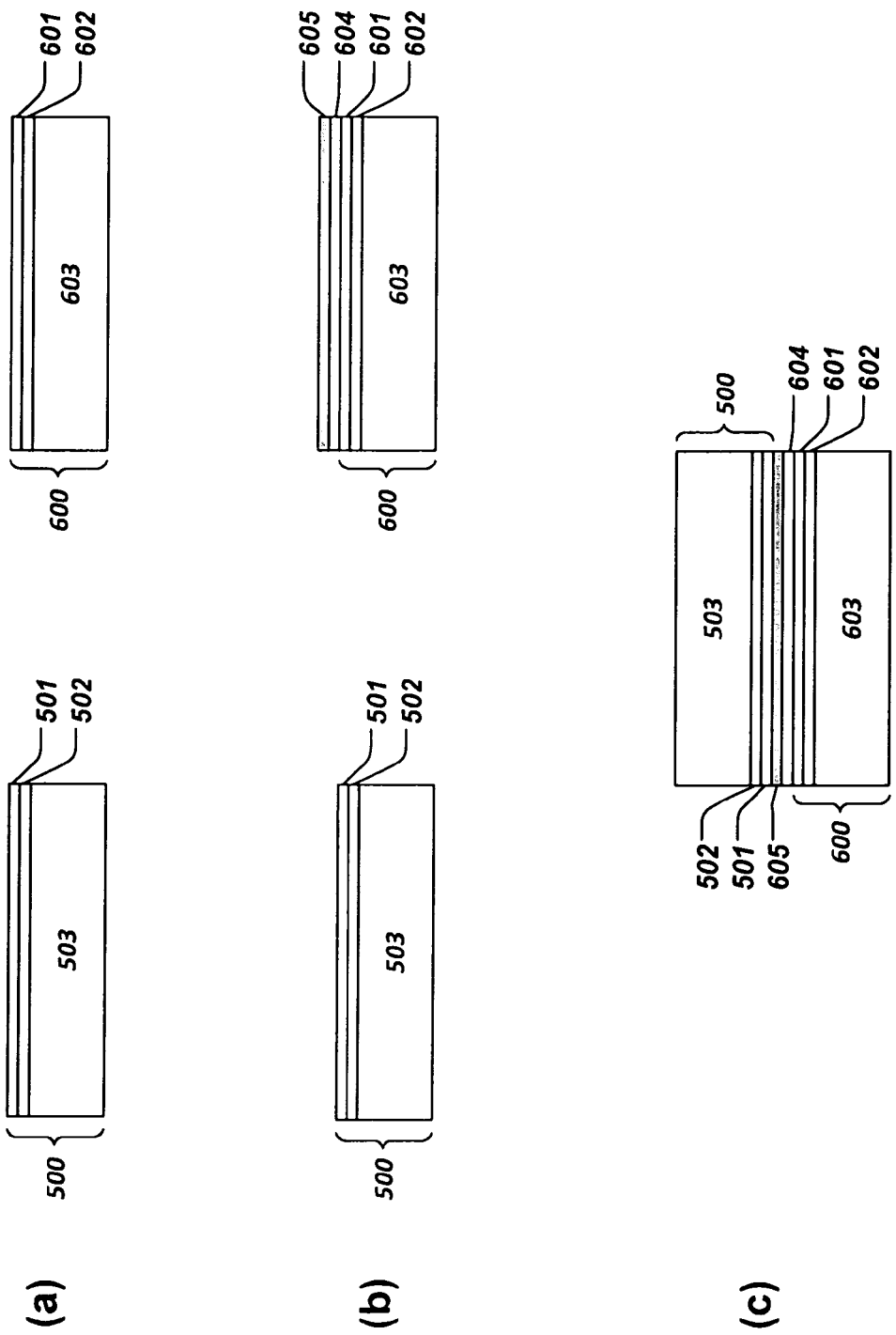
FIG. 9 shows side views of a transistor during different stages (a)-(c) of fabrication according to another implementation.

In an alternative implementation for fabricating a transistor, stages (a)-(c) of FIG. 5 may be replaced with stages (a)-(c) of FIG. 9, followed by stages (d)-(p) of FIGS. 6-8. In stage (a), a layered wafer 500 and a layered wafer 600 are provided. The layered wafer 500 may be, for example, a standard silicon-on-insulator (SOI) wafer that includes a silicon layer 501, an insulator (e.g., $SiO_2$) layer 502, and bulk silicon substrate 503. The silicon layer 501 may have an average thickness of 20 nm. Similarly, the layered wafer 600 may be, for example, a standard silicon-on-insulator (SOI) wafer that includes a silicon layer 601, an insulator (e.g., $SiO_2$) layer 602, and a bulk silicon substrate 603. The silicon layer 601 may have an average thickness of 20 nm.

In stage (b), metal layers 604 and 605 are deposited on the silicon layer 601 of the SOI wafer 600. The materials of the metal layers 604 and 605 may be inert metals such as platinum, iridium, and palladium. Each of the metal layers 604 and 605 may have an average thickness of 2 nm. The metal layers 604 and 605 may be deposited by a physical vapor deposition technique such as sputtering.

In stage (c), the layered wafer 500 and the layered wafer 600 are bonded together using a flip-bond technique. The layered wafer 500 and the layered wafer 600 may be bonded together via metal silicide formation under a moderately low temperature (e.g., 200 degrees to 300 degrees Celsius). The metal layer 605 and the silicon layer 501 may be treated by, for example, removing organic compounds and surface oxides using oxygen plasma, ozone cleaning, or a combination, followed by HF/NH$_4$F dipping.

Figure 10:
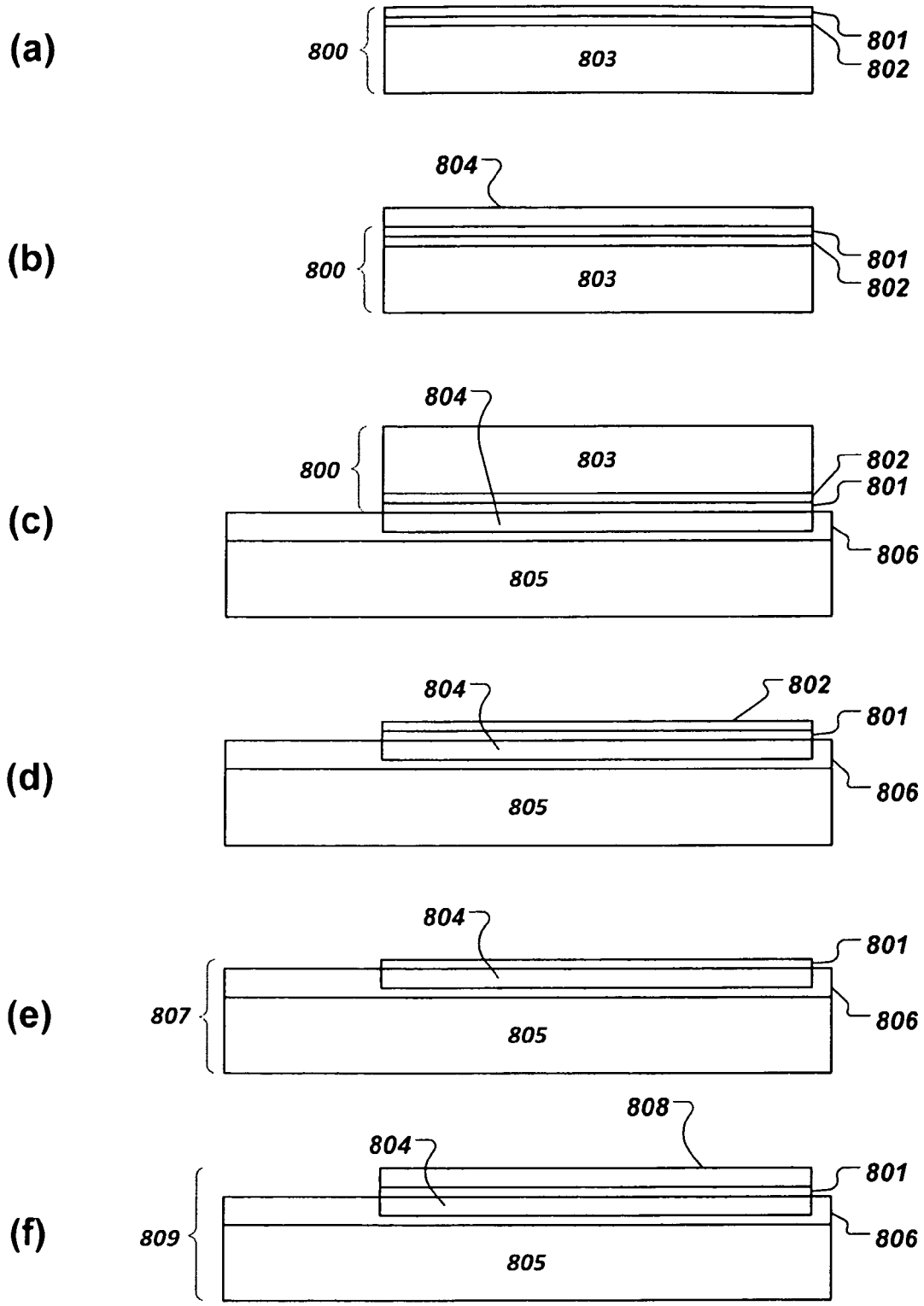
FIGS. 10 and 11 show side views of a transistor during different stages (a)-(f) of fabrication according to another implementation.
Figure 11:
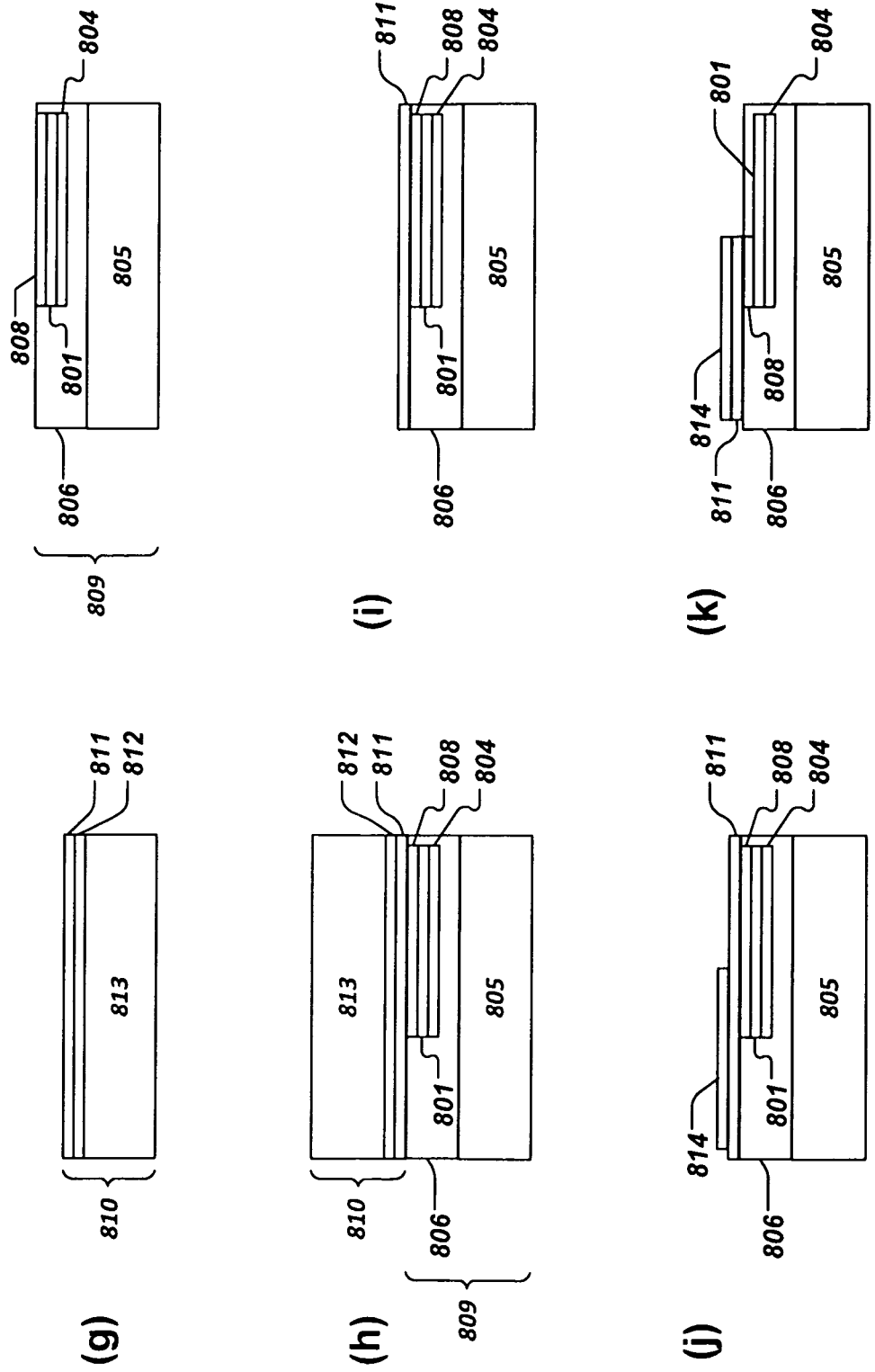

FIGS. 10 and 11 show side views of a transistor during different stages (a)-(f) of fabrication according to another implementation. In stage (a), a layered wafer 800, e.g., a standard silicon-on-insulator (SOI) wafer that includes a silicon layer 801, an insulator (e.g., SiO$_2$) layer 802, and a bulk silicon substrate 803 is provided. The silicon layer 801 may have a desired thickness, doping profile, and crystal orientation.

The SOI wafer 800 is loaded into a metal deposition (e.g., electron beam evaporation or sputter) chamber. When a base pressure of the chamber is sufficiently low (e.g., less than 2×10–6 Torr), a metal 804, such as platinum (Pt), is deposited in stage (b). The Pt layer 804 has a thickness that is sufficiently large (e.g., 15 nm) to form excellent contact with the Si layer 801. An aluminum (Al) layer (not shown) having a thickness that is sufficient for external connection or measurement contact (e.g., 100 nm) may be deposited on the Pt layer 804 at an appropriate rate (e.g., approximately 0.1 nm/sec) to ensure excellent metal film quality. Other metal materials different than Pt and Al may be used.

Following deposition of the metal layer 804, the SOI wafer 800 is flipped and bonded onto a carrier wafer 805 using an adhesive 806 in stage (c). The metal layer 804 is positioned between the Si layer 801 and the carrier wafer 805. The adhesive 806 may be an insulating adhesive or a conducting adhesive. For example, a conducting adhesive may be used for bonding the SOI wafer 800 to the carrier wafer 805 when the surface-doped SOI wafer 800 is not patterned, e.g., when Pt and Al are directly deposited onto the surface-doped SOI wafer 800 as a uniform metal film without patterning.

In stage (d), the bulk silicon substrate 803 of the SOI wafer 800 is thinned down (e.g., by grinding or polishing using sandpaper) and completely removed by selective Si etching (e.g., using xenon difluoride (XeF$_2$) etch) to expose the SiO$_2$ layer 802. At stage (e), the SiO$_2$ layer 802 is selectively etched away (e.g., by dipping in BOE). The remaining structure 807 is the thin device silicon layer 801 with the doped side and the previously deposited metal contact and electrode 804 bonded to the carrier wafer 805 by the adhesive 806.

The structure 807 is loaded into a metal deposition (e.g., electron beam evaporation or sputter) chamber. When the base pressure of the chamber is sufficiently low (e.g., less than 2×10$^{-6}$ Torr), a metal, e.g., cobalt (Co), layer 808 is deposited to form a collector-base diode 809 in stage (f). The Co layer 808 has a thickness that is sufficiently large (e.g., 15 nm) to form excellent contact with the Si layer 801. An aluminum (Al) layer (not shown) having a thickness that is sufficient for external connection or measurement contact (e.g., 100 nm) may be deposited on the Co layer 808 at an appropriate rate (e.g., approximately 0.1 nm/sec) to ensure excellent metal film quality. Other metal materials different than Co and Al may be used.

In stage (g), a layered wafer 813 is provided. The layered wafer 813 may be, for example, a standard silicon-on-insulator (SOI) wafer that includes a silicon layer 811, an insulator (e.g., SiO$_2$) layer 812, and bulk silicon substrate 813. The silicon layer 811 may have an average thickness of 20 nm.

In stage (h), the layered wafer 813 is flip-chip bonded to the collector-base diode 809, followed by a thermal treatment at 200 degrees to 300 degrees Celsius to promote metal silicide formation between the metal layer 806 and the silicon layer 811.

In stage (i), the insulator layer 812 and the bulk silicon substrate 813 of the layered wafer 810 are removed, leaving the silicon layer 811. The bulk silicon substrate 813 may be removed by polishing the bulk silicon substrate 813 to remove a majority of the bulk silicon substrate 813. The bulk silicon substrate 813 remaining after the polishing may be removed by selective etching of the remaining bulk silicon substrate 813 using, for example, xenon difluoride (XeF$_2$). The insulator layer 812 may be removed by selective etching, e.g., buffered oxide etch, of the insulator layer 812 using, for example, hydrofluoric acid (HF).

In stage (j), a metal layer 814 is deposited on the silicon layer 811 to form a metal emitter. The metal layer 814 may be deposited using electron beam evaporation followed by lift-off. The metal layer 814 may include a layer of cobalt with an average thickness of 5 nm and a layer of gold with an average thickness of 100 nm.

In stage (k), an exposed portion of the silicon layer 811 is removed to form a semiconductor barrier under the metal emitter 814. The exposed portion of the silicon layer 811 may be removed using reactive ion etching. The metal layer 808 may be patterned using a negative resist to form a metal base. The metal layer 808 may be patterned using selective wet chemical etch to remove exposed portions of the metal layer 808. The transistor fabricated according to this implementation may be similar to the transistor 100 shown in FIG. 1.

A number of implementations have been described. Nevertheless, various modifications can be made without departing from the spirit and scope of the processes and techniques described herein. In addition, the processes depicted in the figures do not require the particular order shown, or sequential order, to achieve desirable results. In addition, other steps can be provided, or steps can be eliminated, from the described processes, and other components can be added to, or removed from, the describe apparatus and systems. Accordingly, other embodiments are within the scope of the following claims.

What is claimed is:
1. A transistor, comprising:
a first metal-semiconductor-metal sequence comprising a metal emitter, a first semiconductor barrier and a metal base;
wherein the first semiconductor barrier separates the metal emitter and the metal base, with the first semiconductor barrier having an average thickness being based on a first mean free path of a charge carrier in the first semiconductor barrier emitted from the metal emitter; and
a second metal-semiconductor-metal sequence comprising the metal base, a second semiconductor barrier, and a metal collector,
wherein the first and the second metal-semiconductor-metal sequences at least partially overlap with each other to share the metal base;

wherein the second semiconductor barrier separates the metal base from the metal collector, with the second semiconductor barrier having an average thickness being based on a second mean free path of the charge carrier in the second semiconductor barrier injected from the metal base;

wherein one or more of the first metal-semiconductor-metal sequence and the second metal-semiconductor-metal sequence increases a carrier transmission rate from the metal emitter to the metal collector, relative to another carrier transmission rate of the metal emitter to another type of collector;

wherein the metal base comprises two or more metal layers and an average thickness of the metal base is based on a multi-layer mean free path of the charge carrier; and wherein the average thickness of the metal base is one or more of (i) less than the multi-layer mean free path of the charge carrier in transiting the layers of the metal base, and (ii) comparable to the multi-layer mean free path of the charge carrier in transiting the layers of the metal base.

2. The transistor of claim 1, wherein the other type of collector comprises a semiconductor collector.

3. The transistor of claim 1, wherein the first and the second metal-semiconductor-metal sequences decrease a circuit delay relative to a circuit delay with a semiconductor collector and a semiconductor emitter.

4. The transistor of claim 1, wherein a current gain of the transistor is higher than unity.

5. The transistor of claim 1, wherein the second metal-semiconductor-metal sequence decreases an amount of backward scattering of the charge carrier between the metal base and the metal collector, relative to an amount of backward scattering of the second charge carrier between another metal base and the other type of collector.

6. The transistor of claim 1, wherein each of the metal emitter, the metal base, and the metal collector comprises one or more of silver (Ag), aluminum (Al), gold (Au), cobalt (Co), chromium (Cr), copper (Cu), gadolinium (Gd), hafnium (Hf), indium (In), iridium (Ir), magnesium (Mg), manganese (Mn), molybdenum (Mo), nickel (Ni), lead (Pb), palladium (Pd), platinum (Pt), rhodium (Rh), tantalum (Ta), titanium (Ti), tungsten (W), and zinc (Zn).

7. The transistor of claim 1, wherein the metal base comprises at least two metal layers.

8. The transistor of claim 1, wherein the metal base comprises a first layer, a second layer and a third layer between the first layer and the second layer, wherein the third layer includes a material that has a carrier mean free path with an increased length, relative to lengths of carrier mean free paths of other materials, wherein the material decreases series resistance of the metal base relative to other series resistances of other metal bases, and wherein the third layer promotes resistance to oxidation and promotes bonding between the first and the second metal layers.

9. The transistor of claim 1, wherein the average thickness of the metal base is in a range from about 2 nm to 50 nm.

10. The transistor of claim 1, wherein the average thickness of the first semiconductor barrier is less than four times the first mean free path of the charge carrier in the first semiconductor barrier emitted from the metal emitter.

11. The transistor of claim 1, wherein the average thickness of the second semiconductor barrier is less than four times the second mean free path of the charge carrier in the second semiconductor barrier injected from the metal base.

12. The transistor of claim 1, wherein the average thickness of at least one of the first semiconductor barrier and the second semiconductor barrier is in a range from about 5 nm to 200 nm.

13. The transistor of claim 1, wherein a barrier height of the first semiconductor barrier is greater than a barrier height of the second semiconductor barrier.

14. The transistor of claim 1, wherein each of the first semiconductor barrier and the second semiconductor barrier comprises one or more of a crystalline semiconductor and a polycrystalline semiconductor.

15. The transistor of claim 1, wherein each of the first semiconductor barrier and the second semiconductor barrier comprises one or more of silicon (Si), germanium (Ge), silicon germanium (SiGe), aluminum antimonide (AlSb), gallium antimonide (GaSb), gallium arsenide (GaAs), indium antimonide (InSb), indium arsenide (InAs), indium gallium arsenide (InGaAs), gallium nitride (GaN), indium phosphide (InP), cadmium selenide (CdSe), cadmium telluride (CdTe), cadmium sulfide (CdS), zinc selenide (ZnSe), zinc telluride (ZnTe), zinc sulfide (ZnS), zinc oxide (ZnO), titanium oxide (TiO2), lead sulfide (PbS), and lead telluride (PbTe).

16. The transistor of claim 1, wherein an average transit delay through the first semiconductor barrier is less than 20 femtoseconds.

17. The transistor of claim 1, wherein an average transit delay through the second semiconductor barrier is less than 20 femtoseconds.

18. The transistor of claim 1, wherein an average resistance-capacitance (RC) delay in the metal base is less than 20 femtoseconds.

19. The transistor of claim 1, wherein an average transit delay through the metal base is less than 20 femtoseconds.

20. The transistor of claim 1, wherein the transistor has a total delay of less than 80 femtoseconds.

21. The transistor of claim 1, wherein the transistor has a cut-off frequency exceeding 2 THz.

22. A method for fabricating a transistor, comprising:
depositing a first metal layer and a second metal layer on a first semiconductor-on-insulator (SOI) wafer to yield a first layered SOI wafer;
depositing a third metal layer and a fourth metal layer on a second SOI wafer to yield a second layered SOI wafer;
bonding the first layered SOI wafer to the second layered SOI wafer;
removing a portion of the first layered SOI wafer, leaving a first semiconductor layer;
depositing a fifth metal layer on a portion of the first semiconductor layer to form a metal collector;
removing an exposed portion of the first semiconductor layer to form a first semiconductor barrier under the metal collector, the first semiconductor barrier having an average thickness based on a first mean free path of a charge carrier in the first semiconductor barrier;
patterning the first, the second, the third, and the fourth metal layers using a first negative resist, leaving portions of the first, the second, the third, and the fourth metal layers under the first semiconductor barrier and under the first negative resist;
removing the first negative resist;
removing a portion of the second SOI wafer, leaving a second semiconductor layer;
depositing a sixth metal layer on a portion of the second semiconductor layer to form a metal emitter;

removing an exposed portion of the second semiconductor layer to form a second semiconductor barrier under the metal emitter, the second semiconductor barrier having an average thickness being based on a second mean free path of the charge carrier in the second semiconductor barrier emitted from the metal emitter;

patterning the first, the second, the third, and the fourth metal layers using a second negative resist, leaving portions of the first, the second, the third, and the fourth metal layers under the second semiconductor barrier and under the second negative resist to form a metal base, the metal base having an average thickness being based on a multi-layer mean free path of the charge carrier; and removing the second negative resist.

23. The method of claim 22, wherein each of the first metal layer, the second metal layer, the third metal layer, the fourth metal layer, the fifth metal layer, and the sixth metal layer comprises one or more of silver (Ag), aluminum (Al), gold (Au), cobalt (Co), chromium (Cr), copper (Cu), gadolinium (Gd), hafnium (Hf), indium (In), iridium (Ir), magnesium (Mg), manganese (Mn), molybdenum (Mo), nickel (Ni), lead (Pb), palladium (Pd), platinum (Pt), rhodium (Rh), tantalum (Ta), titanium (Ti), tungsten (W), and zinc (Zn).

24. The method of claim 22, wherein each of the first semiconductor layer and the second semiconductor layer comprises one or more of silicon (Si), germanium (Ge), silicon germanium (SiGe), aluminum antimonide (AlSb), gallium antimonide (GaSb), gallium arsenide (GaAs), indium antimonide (InSb), indium arsenide (InAs), indium gallium arsenide (InGaAs), gallium nitride (GaN), indium phosphide (InP), cadmium selenide (CdSe), cadmium telluride (CdTe), cadmium sulfide (CdS), zinc selenide (ZnSe), zinc telluride (ZnTe), zinc sulfide (ZnS), zinc oxide (ZnO), titanium oxide (TiO2), lead sulfide (PbS), and lead telluride (PbTe).

25. The method of claim 22, wherein the average thickness of the first semiconductor barrier is less than four times the first mean free path of the charge carrier in the first semiconductor barrier.

26. The method of claim 22, wherein the average thickness of the second semiconductor barrier is less than four times the second mean free path of the charge carrier in the second semiconductor barrier.

27. The method of claim 22, wherein a barrier height of the first semiconductor barrier is less than a barrier height of the second semiconductor barrier.

28. The method of claim 22, wherein the second metal layer and the fourth metal layer includes a material that has a carrier mean free path with an increased length, relative to lengths of carrier mean free paths of other materials, wherein the material decreases series resistance of the metal base relative to other series resistances of other metal bases, and wherein the material promotes resistance to oxidation and promotes bonding between the first layered SOI wafer and the second layered SOI wafer.

29. The method of claim 22, wherein the average thickness of the metal base is one or more of (i) less than the multi-layer mean free path of the charge carrier in transiting the layers of the metal base of the metal base, and (ii) comparable to the multi-layer mean free path of the charge carrier in transiting the layers of the metal base.

30. The method of claim 22, wherein bonding the first layered SOI wafer to the second layered SOI wafer comprises:

diffusive bonding of the second metal material included in the first bi-metal layer and the second bi-metal layer at an average temperature of about 200 degrees Celsius under pressure.

31. The method of claim 22, further comprising:

after removing the first negative resist, depositing a monomer onto the metal collector and an exposed portion of the second SOI wafer;

depositing a fifth metal layer on a carrier wafer to form a ground plane;

bonding the deposited monomer to the deposited fifth metal layer; and converting the monomer to a polymer.

32. A terahertz transistor, comprising;

a first metal-semiconductor-metal sequence comprising a metal emitter, a first semiconductor barrier and a metal base;

wherein the metal emitter comprises a gadolinium layer with an average thickness of about 5 nm and a gold layer with an average thickness of about 100 nm;

wherein the metal base comprises a cobalt layer with an average thickness of about 2 nm, a gold layer with an average thickness of about 4 nm, and a palladium layer with an average thickness of about 2 nm, wherein the gold layer is between the cobalt layer and the palladium layer, the gold layer has a carrier mean free path with an increased length, relative to other lengths of other carrier mean free paths of other materials, and the gold layer decreases series resistance of the metal base relative to other series resistances of other metal bases;

wherein the first semiconductor barrier separates the metal emitter and the metal base, with the first semiconductor barrier comprising silicon with an average thickness of about 20 nm; and a second metal-semiconductor-metal sequence comprising the metal base, a second semiconductor barrier, and a metal collector, wherein the metal collector comprises a cobalt layer with an average thickness of about 5 nm and a gold layer with an average thickness of about 100 nm;

wherein the second semiconductor barrier separates the base and the metal collector, with the second semiconductor barrier comprising silicon with an average thickness of about 20 nm;

wherein one or more of the first metal-semiconductor-metal sequence and the second metal-semiconductor-metal sequence increases a carrier transmission rate from the metal base into the metal collector, relative to another carrier transmission rate of the metal base into another type of collector; and wherein the increase in the carrier transmission rate facilitates higher than unity current gain, and the terahertz transistor to operate at a terahertz frequency.

33. The transistor of claim 1, wherein the first semiconducting material is a same material as the second semiconducting material.

34. The transistor of claim 1, wherein the first semiconducting material is a different material than the second semiconducting material.

35. A transistor, comprising:

a first metal-semiconductor-metal sequence comprising a metal emitter, a first semiconductor barrier and a metal base;

wherein the first semiconductor barrier separates the metal emitter and the metal base, with the first semiconductor barrier having an average thickness being based on a first mean free path of a charge carrier in the first semiconductor barrier emitted from the metal emitter; and a second metal-semiconductor-metal sequence comprising the metal base, a second semiconductor barrier, and a metal collector, wherein the first and the second metal-semiconductor-metal sequences at least partially overlap with each other to share the metal base;

wherein the second semiconductor barrier separates the metal base from the metal collector, with the second semiconductor barrier having an average thickness being based on a second mean free path of the charge carrier in the second semiconductor barrier injected from the metal base;

wherein one or more of the first metal-semiconductor-metal sequence and the second metal-semiconductor-metal sequence increases a carrier transmission rate from the metal emitter to the metal collector, relative to another carrier transmission rate of the metal emitter to another type of collector;

wherein the metal base comprises two or more metal layers and an average thickness of the metal base is based on a multi-layer mean free path of the charge carrier; and wherein the second metal-semiconductor-metal sequence decreases an amount of backward scattering of the charge carrier between the metal base and the metal collector, relative to an amount of backward scattering of the second charge carrier between another metal base and the other type of collector.

36. A transistor, comprising:

a first metal-semiconductor-metal sequence comprising a metal emitter, a first semiconductor barrier and a metal base;

wherein the first semiconductor barrier separates the metal emitter and the metal base, with the first semiconductor barrier having an average thickness being based on a first mean free path of a charge carrier in the first semiconductor barrier emitted from the metal emitter; and a second metal-semiconductor-metal sequence comprising the metal base, a second semiconductor barrier, and a metal collector, wherein the first and the second metal-semiconductor-metal sequences at least partially overlap with each other to share the metal base;

wherein the second semiconductor barrier separates the metal base from the metal collector, with the second semiconductor barrier having an average thickness being based on a second mean free path of the charge carrier in the second semiconductor barrier injected from the metal base;

wherein one or more of the first metal-semiconductor-metal sequence and the second metal-semiconductor-metal sequence increases a carrier transmission rate from the metal emitter to the metal collector, relative to another carrier transmission rate of the metal emitter to another type of collector;

wherein the metal base comprises two or more metal layers and an average thickness of the metal base is based on a multi-layer mean free path of the charge carrier; and wherein the metal base comprises a first layer, a second layer and a third layer between the first layer and the second layer, wherein the third layer includes a material that has a carrier mean free path with an increased length, relative to lengths of carrier mean free paths of other materials, wherein the material decreases series resistance of the metal base relative to other series resistances of other metal bases, and wherein the third layer promotes resistance to oxidation and promotes bonding between the first and the second metal layers.

* * * * *

UNITED STATES PATENT AND TRADEMARK OFFICE
CERTIFICATE OF CORRECTION

| | |
|---|---|
| PATENT NO. | : 9,543,423 B2 |
| APPLICATION NO. | : 14/425403 |
| DATED | : January 10, 2017 |
| INVENTOR(S) | : Yi Luo et al. |

Page 1 of 1

It is certified that error appears in the above-identified patent and that said Letters Patent is hereby corrected as shown below:

In the Claims

Column 15, Line 62, Claim 29, delete "layers of the metal base of the metal base," and insert -- layers of the metal base, --

Signed and Sealed this
Fourteenth Day of March, 2017

Michelle K. Lee
*Director of the United States Patent and Trademark Office*